United States Patent
Lee et al.

(10) Patent No.: US 8,552,551 B2
(45) Date of Patent: Oct. 8, 2013

(54) ADHESIVE/SPACER ISLAND STRUCTURE FOR STACKING OVER WIRE BONDED DIE

(75) Inventors: Sang Ho Lee, Kyonggi-do (KR); Jong Wook Ju, Kyongman (KR); Hyeog Chan Kwon, Seoul (KR); Marcos Karnezos, Palo Alto, CA (US)

(73) Assignee: CHIPPAC, Inc., Fremont, CA (US)

( * ) Notice: Subject to any disclaimer, the term of this patent is extended or adjusted under 35 U.S.C. 154(b) by 875 days.

(21) Appl. No.: 11/134,845

(22) Filed: May 20, 2005

(65) Prior Publication Data

US 2005/0269676 A1     Dec. 8, 2005

Related U.S. Application Data (63) Continuation-in-part of application No. 10/969,116, filed on Oct. 20, 2004, now abandoned.

(60) Provisional application No. 60/573,903, filed on May 24, 2004, provisional application No. 60/573,956, filed on May 24, 2004.

(51) Int. Cl.
  *H01L 23/48*    (2006.01)
  *H01L 23/52*    (2006.01)

(52) U.S. Cl.
  USPC ........... 257/737; 257/686; 257/777; 257/783; 257/784; 257/E23.169

(58) Field of Classification Search
  USPC ......... 257/678, 725, 686, 777, 778, 737, 783, 257/784, E23.169
  See application file for complete search history.

(56) References Cited

U.S. PATENT DOCUMENTS

| 5,140,404 A | 8/1992 | Fogal et al. |
| 5,218,229 A | 6/1993 | Farnworth |

(Continued)

FOREIGN PATENT DOCUMENTS

| JP | 05152505 A | 6/1993 |
| JP | 2001223326 A | 8/2001 |
| KR | 2001068614 A | 7/2001 |
| KR | 2004085348 A | 10/2004 |

OTHER PUBLICATIONS

Lintec Semiconductor-Related Products Web Site, "Adwill Semiconductor-Related Products", 1 page, http://www.lintec.co.jp/e-dept/english/adwill/adwill.html, downloaded Mar. 1, 2004.

(Continued)

*Primary Examiner* — Nitin Parekh
(74) *Attorney, Agent, or Firm* — Ishimaru & Associates LLP (57) ABSTRACT

Adhesive/spacer structures used to adhere a first device, such as a die, or a package, to a second device in a stacked semiconductor assembly, include a plurality of spaced-apart adhesive/spacer islands securing the first and the second devices to one another at a chosen separation. Either or both of the first and second devices can be a die; or, either or both of the devices can be a package. A package includes a die mounted onto and electrically interconnected to, a substrate, and where one package is stacked over either a lower die or a lower package, the upper package may be oriented either so that the die attach side of the upper package faces toward the lower die or lower package substrate or so that the die attach side of the upper package faces away from the lower die or lower package substrate.

13 Claims, 6 Drawing Sheets

(56) References Cited

U.S. PATENT DOCUMENTS

| | | | |
|---|---|---|---|
| 5,222,014 A | 6/1993 | Lin | |
| 5,229,960 A | 7/1993 | De Givry | |
| 5,323,060 A | 6/1994 | Fogal et al. | |
| 5,340,771 A | 8/1994 | Rostoker | |
| 5,372,883 A | 12/1994 | Shores | |
| 5,373,189 A | 12/1994 | Massit et al. | |
| 5,436,203 A | 7/1995 | Lin | |
| 5,444,296 A | 8/1995 | Kaul et al. | |
| 5,495,398 A | 2/1996 | Takiar et al. | |
| 5,550,711 A | 8/1996 | Burns et al. | |
| 5,652,185 A | 7/1997 | Lee | |
| 5,744,863 A | 4/1998 | Culnane et al. | |
| 5,753,358 A * | 5/1998 | Korleski | 428/308.4 |
| 5,776,799 A | 7/1998 | Song et al. | |
| 5,898,219 A | 4/1999 | Barrow | |
| 5,899,705 A | 5/1999 | Akram | |
| 5,903,049 A | 5/1999 | Mori | |
| 5,945,733 A | 8/1999 | Corbett et al. | |
| 5,977,640 A | 11/1999 | Bertin et al. | |
| 5,982,633 A | 11/1999 | Jeansonne | |
| 5,994,166 A | 11/1999 | Akram et al. | |
| 6,025,648 A | 2/2000 | Takahashi et al. | |
| 6,034,875 A | 3/2000 | Heim et al. | |
| 6,075,289 A | 6/2000 | Distefano | |
| 6,118,176 A | 9/2000 | Tao et al. | |
| 6,133,626 A | 10/2000 | Hawke et al. | |
| 6,157,080 A | 12/2000 | Tamaki et al. | |
| 6,177,729 B1 * | 1/2001 | Benenati et al. | 257/738 |
| 6,201,266 B1 | 3/2001 | Ohuchi et al. | |
| 6,201,302 B1 | 3/2001 | Tzu | |
| 6,238,946 B1 * | 5/2001 | Ziegler | 438/50 |
| 6,238,949 B1 | 5/2001 | Nguyen et al. | |
| 6,265,763 B1 | 7/2001 | Jao et al. | |
| 6,265,766 B1 | 7/2001 | Moden | |
| 6,274,930 B1 | 8/2001 | Vaiyapuri et al. | |
| 6,316,838 B1 | 11/2001 | Ozawa et al. | |
| 6,333,552 B1 | 12/2001 | Kakimoto et al. | |
| 6,333,562 B1 | 12/2001 | Lin | |
| 6,340,846 B1 | 1/2002 | LoBianco et al. | |
| 6,351,028 B1 | 2/2002 | Akram | |
| 6,376,904 B1 | 4/2002 | Haba et al. | |
| 6,388,313 B1 | 5/2002 | Lee et al. | |
| 6,400,007 B1 | 6/2002 | Wu et al. | |
| 6,407,456 B1 | 6/2002 | Ball | |
| 6,413,798 B2 | 7/2002 | Asada | |
| 6,414,381 B1 | 7/2002 | Takeda | |
| 6,424,050 B1 | 7/2002 | Komiyama | |
| 6,436,732 B2 | 8/2002 | Ahmad | |
| 6,441,496 B1 * | 8/2002 | Chen et al. | 257/777 |
| 6,445,064 B1 | 9/2002 | Ishii et al. | |
| 6,462,421 B1 | 10/2002 | Hsu et al. | |
| 6,472,732 B1 | 10/2002 | Terui | |
| 6,472,741 B1 | 10/2002 | Chen et al. | |
| 6,472,758 B1 * | 10/2002 | Glenn et al. | 257/777 |
| 6,489,676 B2 | 12/2002 | Taniguchi et al. | |
| 6,492,726 B1 | 12/2002 | Quek et al. | |
| 6,501,165 B1 | 12/2002 | Farnworth et al. | |
| 6,503,821 B2 | 1/2003 | Farquhar et al. | |
| 6,512,303 B2 | 1/2003 | Moden | |
| 6,538,319 B2 | 3/2003 | Terui | |
| 6,545,365 B2 | 4/2003 | Kondo et al. | |
| 6,545,366 B2 | 4/2003 | Michii et al. | |
| 6,552,423 B2 | 4/2003 | Song et al. | |
| 6,555,902 B2 | 4/2003 | Lo et al. | |
| 6,569,709 B2 * | 5/2003 | Derderian | 438/109 |
| 6,570,249 B1 | 5/2003 | Liao et al. | |
| 6,583,503 B2 | 6/2003 | Akram et al. | |
| 6,590,281 B2 | 7/2003 | Wu et al. | |
| 6,593,647 B2 | 7/2003 | Ichikawa | |
| 6,593,648 B2 | 7/2003 | Emoto | |
| 6,593,662 B1 | 7/2003 | Pu et al. | |
| 6,599,779 B2 | 7/2003 | Shim et al. | |
| 6,607,937 B1 | 8/2003 | Corisis | |
| 6,611,063 B1 | 8/2003 | Ichinose et al. | |
| 6,620,651 B2 | 9/2003 | He et al. | |
| 6,621,169 B2 | 9/2003 | Kikuma et al. | |
| 6,621,172 B2 | 9/2003 | Nakayama et al. | |
| 6,649,448 B2 | 11/2003 | Tomihara | |
| 6,650,009 B2 | 11/2003 | Her et al. | |
| 6,650,019 B2 * | 11/2003 | Glenn et al. | 257/777 |
| 6,660,560 B2 | 12/2003 | Chaudhuri et al. | |
| 6,667,556 B2 | 12/2003 | Moden | |
| 6,690,089 B2 | 2/2004 | Uchida | |
| 6,700,178 B2 | 3/2004 | Chen et al. | |
| 6,706,557 B2 | 3/2004 | Koopmans | |
| 6,710,455 B2 | 3/2004 | Goller et al. | |
| 6,716,676 B2 | 4/2004 | Chen et al. | |
| 6,734,539 B2 | 5/2004 | Degani et al. | |
| 6,734,552 B2 | 5/2004 | Combs et al. | |
| 6,737,750 B1 | 5/2004 | Hoffman et al. | |
| 6,746,894 B2 | 6/2004 | Fee et al. | |
| 6,747,361 B2 | 6/2004 | Ichinose | |
| 6,753,613 B2 * | 6/2004 | Levardo et al. | 257/780 |
| 6,762,488 B2 | 7/2004 | Maeda et al. | |
| 6,777,799 B2 | 8/2004 | Kikuma et al. | |
| 6,777,819 B2 | 8/2004 | Huang | |
| 6,784,555 B2 * | 8/2004 | Watson | 257/783 |
| 6,787,915 B2 | 9/2004 | Uchida et al. | |
| 6,787,916 B2 | 9/2004 | Halahan | |
| 6,794,749 B2 | 9/2004 | Akram | |
| 6,818,980 B1 | 11/2004 | Pedron, Jr. | |
| 6,828,665 B2 | 12/2004 | Pu et al. | |
| 6,833,287 B1 | 12/2004 | Hur et al. | |
| 6,835,598 B2 | 12/2004 | Baek et al. | |
| 6,838,761 B2 | 1/2005 | Karnezos | |
| 6,847,105 B2 | 1/2005 | Koopmans | |
| 6,858,468 B2 * | 2/2005 | Nguyen et al. | 438/108 |
| 6,864,566 B2 | 3/2005 | Choi | |
| 6,882,057 B2 | 4/2005 | Hsu | |
| 6,885,093 B2 | 4/2005 | Lo et al. | |
| 6,890,798 B2 | 5/2005 | McMahon | |
| 6,900,528 B2 | 5/2005 | Mess et al. | |
| 6,906,415 B2 | 6/2005 | Jiang et al. | |
| 6,906,416 B2 | 6/2005 | Karnezos | |
| 6,919,627 B2 | 7/2005 | Liu et al. | |
| 6,930,378 B1 | 8/2005 | St. Amand et al. | |
| 6,930,396 B2 | 8/2005 | Kurita et al. | |
| 6,933,598 B2 | 8/2005 | Karnezos | |
| 6,951,982 B2 | 10/2005 | Chye et al. | |
| 6,972,481 B2 | 12/2005 | Karnezos | |
| 7,034,387 B2 | 4/2006 | Karnezos | |
| 7,034,388 B2 | 4/2006 | Yang et al. | |
| 7,045,887 B2 | 5/2006 | Karnezos | |
| 7,049,691 B2 | 5/2006 | Karnezos | |
| 7,053,476 B2 | 5/2006 | Karnezos | |
| 7,053,477 B2 | 5/2006 | Karnezos et al. | |
| 7,057,269 B2 | 6/2006 | Karnezos | |
| 7,061,088 B2 | 6/2006 | Karnezos | |
| 7,064,426 B2 | 6/2006 | Karnezos | |
| 7,071,568 B1 | 7/2006 | St. Amand et al. | |
| 7,081,678 B2 | 7/2006 | Liu | |
| 7,101,731 B2 | 9/2006 | Karnezos | |
| 7,247,942 B2 * | 7/2007 | Nguyen et al. | 257/733 |
| 2002/0096755 A1 | 7/2002 | Fukui et al. | |
| 2002/0130404 A1 | 9/2002 | Ushijima et al. | |
| 2003/0038357 A1 | 2/2003 | Derderian | |
| 2003/0038374 A1 | 2/2003 | Shim et al. | |
| 2003/0054162 A1 | 3/2003 | Watson | |
| 2003/0113952 A1 | 6/2003 | Sambasivam et al. | |
| 2003/0141582 A1 | 7/2003 | Yang et al. | |
| 2003/0153134 A1 | 8/2003 | Kawata et al. | |
| 2003/0178710 A1 | 9/2003 | Kang et al. | |
| 2004/0016939 A1 | 1/2004 | Akiba et al. | |
| 2004/0026768 A1 | 2/2004 | Taar et al. | |
| 2004/0039127 A1 | 2/2004 | Amou et al. | |
| 2004/0061213 A1 | 4/2004 | Karnezos | |
| 2004/0195667 A1 | 10/2004 | Karnezos | |
| 2004/0212096 A1 | 10/2004 | Wang | |
| 2005/0090050 A1 * | 4/2005 | Shim et al. | 438/200 |

(56) References Cited

U.S. PATENT DOCUMENTS

| | | |
|---|---|---|
| 2005/0106779 A1 | 5/2005 | Bolken et al. |
| 2005/0224959 A1 | 10/2005 | Kwon et al. |
| 2005/0243268 A1 | 11/2005 | Nisato et al. |
| 2006/0043556 A1 | 3/2006 | Su et al. |
| 2006/0138631 A1 | 6/2006 | Tao et al. |
| 2006/0189033 A1 | 8/2006 | Kim |
| 2006/0197209 A1 | 9/2006 | Choi et al. |

OTHER PUBLICATIONS

Lintec Semiconductor-Related Products Web Site, "Products for Dicing Process", 2 pages, http://www.lintec.co.jp/e-dept/english/adwill/diceproces.html, downloaded Mar. 1, 2004.

Lintec Semiconductor-Related Products Web Site, "Products for back-grinding process", 1 page, http://www.lintec.co.jp/e-dept/english/adwill/bgproces.html, Downloaded Mar. 1, 2004.

\* cited by examiner

ADHESIVE/SPACER ISLAND STRUCTURE FOR STACKING OVER WIRE BONDED DIE

CROSS-REFERENCE TO RELATED APPLICATIONS

This application is a Continuation-In-Part of U.S. application Ser. No. 10/969,116, filed Oct. 20, 2004, now abandoned titled "Adhesive/spacer island structure for multiple die package". The said U.S. application Ser. No. 10/969,116 claims priority from U.S. Provisional Application No. 60/573,903, filed May 24, 2004, titled "Adhesive spacer island structure for multiple die package"; and also claims priority from related U.S. Provisional Application No. 60/573,956, filed May 24, 2004, titled "Multiple die package with adhesive/spacer structure and insulated die surface". This application is related to concurrently filed U.S. application Ser. No. 11/134,035.

BACKGROUND

To obtain the maximum function and efficiency from a package having minimum dimensions, various types of increased density packages have been developed. Among these various types of packages is the multiple-die semiconductor chip package, commonly referred to as a multi-chip module, multi-chip package or stacked chip package. A multi-chip package includes one or more integrated circuit semiconductor chips, often referred to as circuit die, stacked one onto another to provide the advantages of light weight, high density, and enhanced electrical performance. To stack the semiconductor chips, each chip can be lifted by a chip-bonding tool, which is usually mounted at the end of a pick-and-place device, and mounted onto the substrate or onto a semiconductor chip mounted previously.

In some circumstances, such as when the upper die is smaller than the lower die, the upper die can be attached directly to the lower die without the use of spacers. However, when spacers are needed between the upper and lower die, spacer die, that is die without circuitry, can be used between the upper and lower die. In addition, adhesives containing spacer elements, typically micro spheres, are often used to properly separate the upper and lower die. See U.S. Pat. Nos. 5,323,060; 6,333,562; 6,340,846; 6,388,313; 6,472,758; 6,569,709; 6,593,662; 6,441,496; and U.S. patent publication number US 2003/0178710.

After the chip mounting process, bonding pads of the chips are connected to bonding pads of the substrate with Au or Al wires during a wire bonding process to create an array of semiconductor chip devices. Finally, the semiconductor chips and their associated wires connected to the substrate are encapsulated, typically using an epoxy-molding compound, to create an array of encapsulated semiconductor devices. The molding compound protects the semiconductor devices from the external environment, such as physical shock and humidity. After encapsulation, the encapsulated devices are separated, typically by sawing, into individual semiconductor chip packages.

SUMMARY

In general, the invention features adhesive/spacer structures used to adhere a first device, such as a die, or a package, to a second device such as a die, or a package, or a heat spreader, in a stacked semiconductor assembly. The adhesive/spacer structure according to the invention includes a plurality of spaced-apart adhesive/spacer islands securing the first and the second devices to one another at a chosen separation. Either or both of the first and second devices can be a die; or, either or both of the devices can be a package. A package includes a die mounted onto and electrically interconnected to, a substrate, and where one package (an "upper" package) is stacked over either a lower die or a lower package, the upper package may be oriented either so that the die attach side of the upper package faces toward the lower die or lower package substrate (that is, the upper package may be inverted), or so that the die attach side of the upper package faces away from the lower die or lower package substrate.

In one general aspect the invention features an adhesive/spacer structure used to adhere first and second devices to one another at a chosen separation in a multiple-device semiconductor chip package. The adhesive/spacer structure comprises a plurality of spaced-apart adhesive/spacer islands securing the first and second devices to one another at a chosen separation. In some embodiments both the first and the second devices are die; in some embodiments the first device is a die, and the second device is a package or a heat spreader. In some embodiments both the first and the second devices are packages. The adhesive/spacer structure can in some embodiments serve to provide a separation between the device that accommodates wire bonds connected to pads on a surface of one of the two devices. In other embodiments the adhesive/spacer structure serves to raise an upper device over a lower substrate to provide space for an additional component such as another die, adjacent a lower die.

Where the first device is a die, the first die is mounted to the substrate, the first die having a first surface bounded by a periphery and having bond pads at the first surface. Wires are bonded to and extend from the bond pads outwardly past the periphery to the substrate. A second surface of a second device (which may be a die, or a package, or a heat spreader, for example) is positioned opposite the first surface to define a die bonding region therebetween. A plurality of spaced-apart adhesive/spacer islands are within the die bonding region and secure the first die and the second device to one another at a chosen separation to create a multiple-die assembly. The adhesive/spacer islands comprise spacer elements within an adhesive. A material encapsulates the multiple-device assembly to create a multiple-device semiconductor chip package.

In another aspect the invention features an adhesive/spacer structure used to adhere first and second die to one another at a chosen separation in a multiple-die semiconductor chip package. The adhesive/spacer structure comprises a plurality of spaced-apart adhesive/spacer islands securing the first and second die to one another at a chosen separation. The adhesive/spacer structure in such embodiments serves to provide a separation between the device that accommodates wire bonds connected to pads on a surface of one of the two die. In other embodiments the adhesive/spacer structure serves to raise an upper die over a lower substrate to provide space for an additional component such as another die, adjacent a lower die.

In another aspect the invention features a multiple-die semiconductor chip package having the adhesive/spacer island structure securing first and second die to one another at a chosen separation. A first die is mounted to the substrate, the first die having a first surface bounded by a periphery and having bond pads at the first surface. Wires are bonded to and extend from the bond pads outwardly past the periphery to the substrate. A second surface of a second die is positioned opposite the first surface to define a die bonding region therebetween. A plurality of spaced-apart adhesive/spacer islands are within the die bonding region and secure the first and second die to one another at a chosen separation to create a multiple-die assembly. The adhesive/spacer islands comprise spacer elements within an adhesive. A material encapsulates the multiple-die assembly to create a multiple-die semiconductor chip package.

In another aspect the invention features an adhesive/spacer structure used to adhere opposed surfaces of first and second die to one another at a chosen separation in a multiple-die semiconductor chip assembly. The first and second die define a die bonding region therebetween. The adhesive/spacer structure comprises spacer elements within an adhesive. The adhesive/spacer structure secures the first and second die to one another and occupies at most about 50% of the die bonding region.

In another aspect the invention features a multiple-die semiconductor chip package. A first die is mounted to a substrate, the first die having a first surface bounded by a periphery and having bond pads at the first surface. Wires are bonded to and extend from the bond pads outwardly past the periphery to the substrate. A second surface of a second die is positioned opposite the first surface to define a die bonding region therebetween. An adhesive/spacer structure within the die bonding region secures the first and second surfaces to one another at a chosen separation to create a multiple-die assembly. The adhesive/spacer structure comprises spacer elements within an adhesive. The adhesive/spacer structure occupies at most about 50% of the die bonding region. A material encapsulates the multiple-die assembly to create a multiple-die semiconductor chip package.

In another aspect the invention features a method for adhering first and second die to one another at a chosen separation in a multiple-die semiconductor chip package-assembly. An adhesive/spacer material having spacer elements within an adhesive is selected. The adhesive/spacer material is deposited onto a first surface of a first die at a plurality of spaced-apart positions. A second surface of a second die is located opposite the first surface of the first die and in contact with the adhesive/spacer material therebetween thereby securing the first and second die to one another at a chosen separation. The selecting and depositing steps are carried out to create a plurality of spaced-apart adhesive/spacer islands following the securing step.

In another aspect the invention features a method for creating a multiple-die semiconductor chip package. A first die is mounted to a substrate, the first die having a first surface with bond pads at the first surface. The bond pads are connected to the substrate with wires. An adhesive/spacer material, comprising spacer elements within an adhesive, is selected. The adhesive/spacer material is deposited onto the first surface of the first die at a plurality of spaced-apart positions. A second surface of a second die is located opposite the first surface of the first die and in contact with the adhesive/spacer material therebetween thereby: defining a die bonding region between the first and second surfaces, and securing the first and second die to one another at a chosen separation to create a multiple-die assembly. The selecting and depositing steps are carried out to create a plurality of spaced-apart adhesive/spacer islands following the securing step. The multiple-die assembly is encapsulated to create a multiple-die semiconductor chip package.

In another aspect the invention features a method for adhering opposed surfaces of first and second die to one another at a chosen separation in a multiple-die semiconductor chip package assembly. An adhesive/spacer material, having spacer elements within an adhesive, is selected. An amount of the adhesive/spacer material is chosen. The chosen amount the adhesive/spacer material is deposited onto a first surface of a first die. A second surface of a second die is located opposite at the first surface of the first die and in contact with the adhesive/spacer material therebetween thereby: defining a die bonding region between the first and second surfaces, and securing the first and second die to one another at a chosen separation. The choosing and depositing steps are carried out so that the adhesive/spacer material occupies at most about 50% of the die bonding region following the securing step.

In another aspect the invention features a method for creating a multiple-die semiconductor chip package. A first die, comprising a first surface with bond pads at the first surface, is mounted to a substrate. The bond pads and the substrate are connected with wires. An adhesive/spacer material having spacer elements within an adhesive is selected. The adhesive/spacer material is deposited onto a first surface of the first die at a plurality of spaced-apart positions. A second surface of a second die is located opposite at the first surface of the first die and in contact with the adhesive/spacer material therebetween thereby: defining a die bonding region between the first and second surfaces, and securing the first and second die to one another at a chosen separation to create a multiple-die assembly. The selecting and depositing steps are carried out so that the adhesive/spacer material occupies at most about 50% of the die bonding region. The multiple-die assembly is encapsulated to create a multiple-die semiconductor chip package, with the encapsulating material occupying a second percentage of the die bonding region.

In another aspect the invention features adhesive/spacer structures used to adhere a first device, such as a die, or a package, to a second device such as a die, or a package, or a heat spreader, in a stacked semiconductor assembly. The adhesive/spacer structure according to the invention includes a plurality of spaced-apart adhesive/spacer islands securing the first and the second devices to one another at a chosen separation. In some embodiments the first devices is a die; in other embodiments the first device is a package; in still other embodiments the second device is be a package. A package includes a die mounted onto and electrically interconnected to, a substrate, and where one package (an "upper" package) is stacked over either a lower die or a lower package, the upper package may be oriented either so that the die attach side of the upper package faces toward the lower die or lower package substrate (that is, the upper package may be inverted), or so that the die attach side of the upper package faces away from the lower die or lower package substrate.

The present invention provides several potential advantages over conventional die stacking structures, specifically silicon spacer die and conventional spacer adhesives. The number of processing steps is reduced compared to conventional packages using silicon spacer wafers. According to the present invention, material processing can be simplified, the amount of spacer material used can be reduced and package reliability and productivity can be potentially increased.

Various features and advantages of the invention will appear from the following description in which the preferred embodiments have been set forth in detail in conjunction with the accompanying drawings.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Terms of orientation, such as "upper" and "lower" and the like are employed for reference to the relative orientation of the various features as shown in the FIGs., it being understood that any of the various assemblies can be deployed in any orientation in use.

Several prior art structures and embodiments made according to the invention are discussed below. Like reference numerals refer to like elements.

Figure 1:
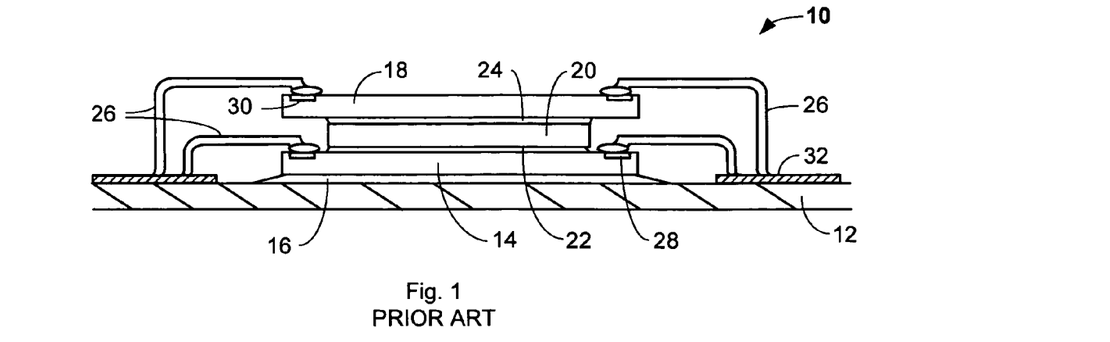
FIGS. 1 and 2 are side views of conventional multiple die assemblies using a spacer die and an adhesive/spacer material to separate the upper and lower die, respectively.
Figure 2:
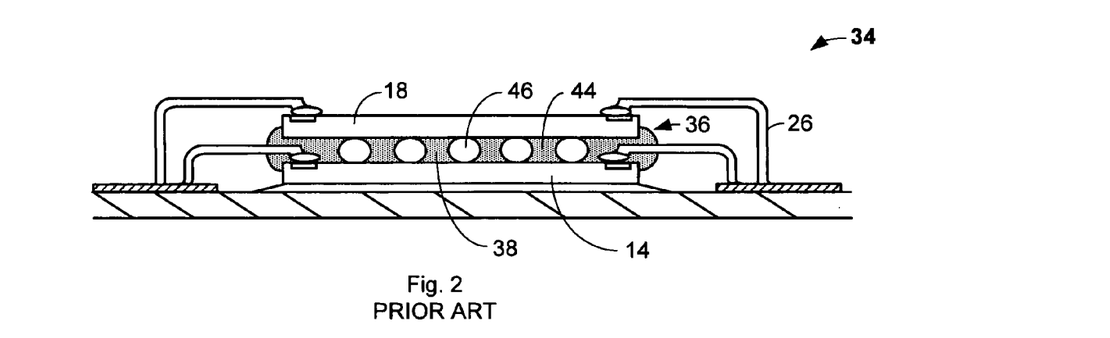
Figure 3:
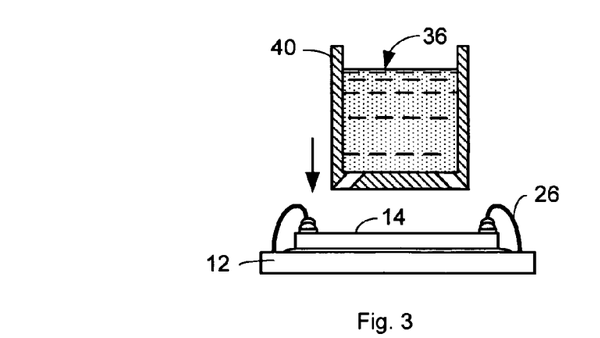
FIGS. 3-5 illustrate deposition of adhesive/spacer material onto a lower die using a shower head-type of dispenser according to an aspect of the invention.
Figure 4:
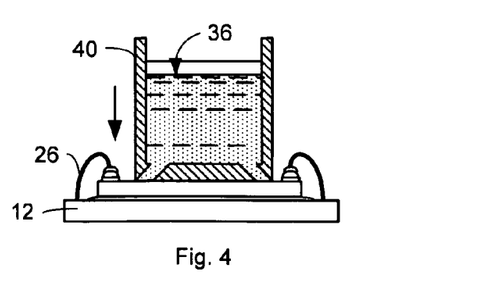

FIG. 1 illustrates a conventional multiple die assembly 10 comprising a substrate 12 to which a first, lower die 14 is adhered using an adhesive 16. A second, upper die 18 is mounted to first die 14 by a spacer die 20, the spacer die being adhered to first and second die 14, 18 by adhesive layers 22, 24. Wires 26 connect bond pads 28, 30 of first and second die 14, 18 with bond pads 32 on substrate 12. FIG. 2 shows a conventional multiple die assembly 34 similar to that of FIG. 1 but using a spacer/adhesive material 36 instead of spacer die 20 and adhesive layers 22, 24. Spacer/adhesive material 36 completely fills the die-bonding region 38 defined between first and second die 14, 18.

The invention will now be described with reference to a stacked die assembly, in which a spacer/adhesive island structure provides a separation between adjacent stacked die.

FIGS. 3-6 illustrate one procedure according to the invention for applying adhesive/spacer material 36 to a first die 14. In this embodiment a shower head-type dispenser 40 is used to apply material 36 at four spaced apart positions on first die 14. It is typically preferred to use a dot pattern type of shower head-type dispenser 40 instead of a conventional dispenser capillary because the one-step injection process can reduce dispensing time. Also, the amount and position for each deposit 42 can also be more easily controlled.

Figure 5:
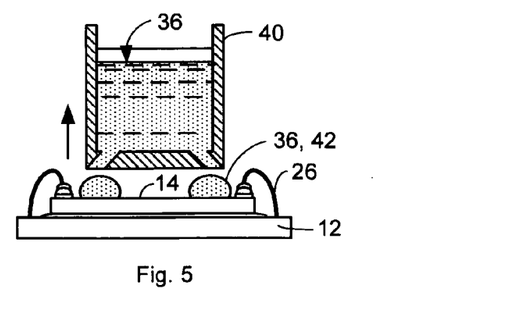
Figure 6:
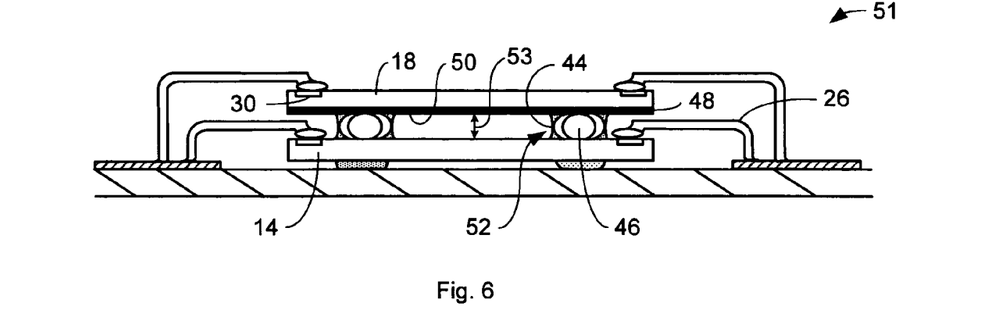
FIG. 6 is a side view of a multiple-die assembly made according to an aspect of the invention following the deposition step of FIG. 5 and placement of an upper die onto the deposits of adhesive/spacer material creating adhesive/spacer islands supporting the upper die on and securing the upper die to the lower die.
Figure 7:
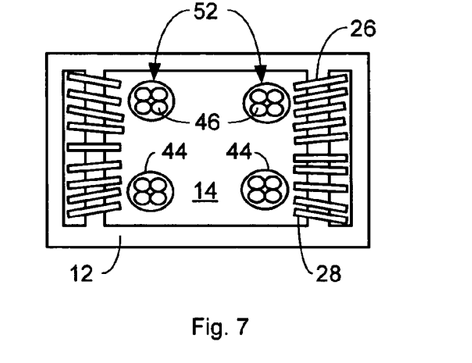
FIG. 7 is a top view of the assembly of FIG. 6 with the top die removed to illustrate the adhesive/spacer islands.

Each deposit 42 of material 36, see also FIGS. 5-7, comprises adhesive 44 and at least one spacer element 46. Deformable is defined as a physical characteristic that is compressible, pliable, or a combination thereof. Material 36 may be a conventional material such as Loctite® QMI536-3, 4, or 6, which uses nominal 3, 4 or 6 mil (75, 100 and 150 micrometers) diameter organic polymer spherical particles as spacer elements 46, or a spacer adhesive from the Ablestik 2025 Sx series. It is preferred that spacer elements 46 be a deformable organic polymer material and pliable and large enough to accommodate the wires 26 extending from bond pads 28 on, in this embodiment, first die 14. Spacer elements 46 are typically about 30-250 micrometers in diameter. Material 36 also helps to provide bond line thickness control and die tilt control. Examples of suitable materials for spacer elements 46 include PTFE and other deformable polymers. Therefore, the spacer elements 46 are deformable.

Spacer elements 46, prior to use, are typically spherical, ellipsoidal, cylindrical with hemispherical or ellipsoidal ends, or the like. After assembly, assuming spacer elements 46 are compressible, spacer elements 46 are compressed to some degree and have flattened areas where they contact lower and upper die 14, 18; the shape of such spacers is collectively referred to as generally ellipsoidal. Hence, the deformable spacer elements 46 are defined as a structure that is compressible, pliable, or a combination thereof for separating the upper and lower die. For example, an initially spherical spacer element 46 having an 8 mil (200 micrometer) diameter will typically compress to a height of about 7.5 mil (188 micrometers). The height of spacers 46, which is equal to chosen separation 53, is usually at least equal to the wire loop height, is more usually greater than the wire loop height, and can be at least about 10% greater than the wire loop height, of wires 26 extending from bond pads 28 of first, lower die 14. If desired, the selection of the spacer elements includes selecting spacer elements so that chosen separation 53 is equal to at least a design wire loop height plus an allowance for manufacturing tolerance build-up resulting from making the wire bonds, the variance in the size and compressibility the of spacer elements 46 and other appropriate variables.

Figure 8:
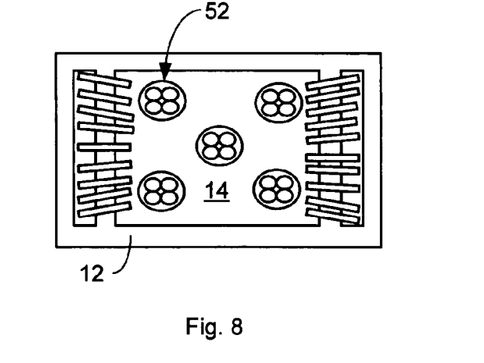
FIG. 8 illustrates an alternative embodiment of the structure shown in FIG. 7.

FIG. 8 illustrates an alternative embodiment in which dispenser 40 previously dispensed five spaced apart deposits 42 of material 36 onto first die 14. The number, size and position of deposits 42 will depend upon various factors including the size of the die and the package description.

Following the deposition of deposits 42, second, upper die 18, preferably having a dielectric layer 48 at its second, lower surface 50, is secured to first, lower die 14 by deposits 42 of material 36 to create a multiple-die assembly 51 with upper and lower die 14, 18 separated by a chosen separation 53. See FIG. 6. This causes deposits 42 to spread out somewhat, see FIGS. 7 and 8, creating adhesive/spacer islands 52 spaced apart from one another. In the embodiment of FIGS. 3-8, each deposit 42 of material 36 creates a separate adhesive/spacer island 52; that is, none of the deposits 42 merge. In some situations certain of the deposits 42 of material 36 may merge while still creating a plurality of adhesive/spacer islands 52. See, for example, the adhesive/spacer islands 52A of FIGS. 9 and 10.

The dielectric layer 48 serves to prevent electrical shorting in the event of contact between the die 18 and the wire loops between it and the die 14 upon which it is mounted. This provides a significant advantage in manufacturing, according to the invention. Where no dielectric layer is provided on the underside of the upper die in a stack, the finished separation between the lower surface of the upper die and the upper surface of the lower die must necessarily be at least as great as the design wire loop height above the upper surface of the lower die. Because of variations in manufacture the specified separation must be made considerably greater than the design wire loop height; particularly, for example, some allowance must be made for variation in the actual heights of the loops, variation in the size of the spacer elements (particularly, variation in the height dimension of the compressed spacer elements). These allowances can result in significant addition to the separation in the finished stack and, therefore, these allowances can result significant increase in the overall thickness of the finished package. The effect is greater where a multiple die package includes more than two separated (spaced apart) stacked die.

In contrast, where the underside of the upper die in a stacked pair of die according to the invention is provided with a dielectric layer, the allowance may be considerably reduced. Although it may not be particularly desirable for the wire loops to contact the underside of the upper die (that is, to contact dielectric layer), it is not fatal to the package if contact sometimes results during manufacture and, accordingly, it is not necessary to add significantly to the separation specification or to the resulting package height.

Figures 9, 10:
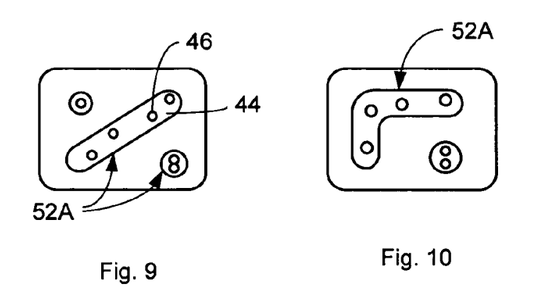
FIGS. 9-11 illustrate alternative embodiments of the lower die of FIG. 7 with adhesive/spacer islands having various sizes and shapes.
Figure 11:
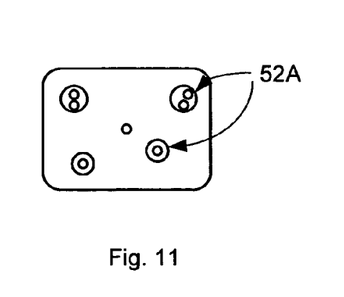

The multiple spacer island embodiments of FIGS. 6-11 may be designed so that each of the adhesive/spacer islands 52 is the same size, such as in FIGS. 6 and 7, or of different sizes, such as adhesive/spacer islands 52A in FIGS. 9-11. Adhesive/spacer islands 52, 52A occupy only a percentage of die bonding region 38, preferably at most about 50% and more preferably about 20-50 percent of die bonding region 38.

Figure 12:
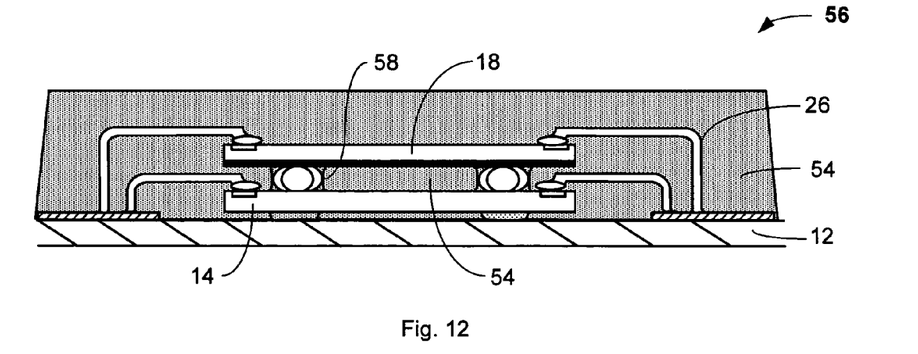
FIG. 12 illustrates a multiple-die semiconductor chip package made according to the invention by encapsulating the multiple-die assembly of FIG. 6 with an encapsulating material.

Thereafter, an encapsulating material 54 is used to create a multiple-die semiconductor chip package 56 as shown in FIG. 12. The encapsulating process typically occurs under a vacuum so that encapsulating material 54 also effectively fills the open regions between islands 52, 52A so that encapsulating material 54, wires 26 and islands 52 occupied about 100% of die bonding region 38 therefore effectively eliminating voids within the die bonding region.

Encapsulating material 54 may be a conventional material comprising a filled epoxy; filled epoxy materials typically comprise about 80-90 percent small, hard filler material, typically 5-10 micrometer glass or ceramic particles. Therefore, conventional encapsulating material 54 may not be suitable for use as adhesive 58 because the small, hard filler material could be captured between spacer element 46 and either or both of die 14, 18, resulting in damage to the die. Boundaries 58 are created between adhesive/spacer islands 52 and encapsulating material (molding compound) 54.

The materials of the spacer/adhesive island structure can be selected to optimize package stability as follows. Molding compounds (encapsulation materials) typically have very different properties from conventional (polymer) adhesives. Molding compounds (or encapsulating materials) are typically highly-filled epoxies; that is, they are composed of an epoxy filled with a high proportion of a fine (submicron size) particulate filler (as much as 80%-90%, for example) such as silicon or glass. Conventional polymer adhesives, in contrast, are not filled, or are filled to a much lesser extent. Molding compound epoxies are typically selected as having strong adhesion to both silicon (die) and to various substrates. According to the invention, preferred materials for adhesive component 44 of spacer islands 52 are epoxies having qualities similar to those of a molding compound. The adhesive component 44 may be selected so that various of the physical characteristics (for example, thermal expansion coefficient) of the cured adhesive component 44 of the spacer islands 52 match those of the molding compound 54. Also, preferred materials for the adhesive component 44 of the spacer islands 52 are, like at least some molding compounds, less likely to absorb moisture. Selection of the adhesive component of the spacer islands according to these criteria can improve the mechanical stability of the completed package, reducing the incidence, for example, of delamination of the various components in the completed package or warpage of the completed package.

As noted above, in these embodiments the height of spacers 46 is selected to provide a chosen separation 53, large enough to accommodate the wires 26 extending from bond pads 28 on, in this embodiment, first die 14. Spacer elements 46 can accordingly typically be about 30-250 micrometers in diameter. However, in the event where the wire loop height may be substantially reduced (as, for example, where reverse wire bonding is employed), the separation 53 must nevertheless be selected to be great enough to allow for flow of the molding compound between the stacked devices during the encapsulation process. The minimum separation, which can be readily determined without undue experimentation, depends upon, among other factors, the characteristics of the molding compound itself (for example its rheology), and the extent of the opposed surfaces between which the molding compound must flow. For a typical molding compound, for example, if the molding compound must travel over a distance of about 10 mm between the stacked devices, a separation of about 150 um between the opposed device surfaces may be expected to suffice; if the length of travel is about 3-4 mm, the gap typically can be as small as about 50 um. These parameters, and other pertinent ones (pressure, time, temperature for molding compound flow-in), are known in the art, and various algorithms are routinely employed to determine what separation may be required, or conversely, what conditions may be used to achieve void-free encapsulation using a selected molding compound and a given separation between components. Computer programs can be employed without undue experimentation to model optimal sizes, numbers, and arrangements of adhesive/spacer islands according to the invention.

Figure 13:
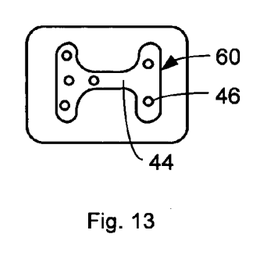
FIGS. 13-15 illustrate continuous expanses of adhesive/spacer material instead of spaced-apart adhesive/spacer islands.
Figure 14:
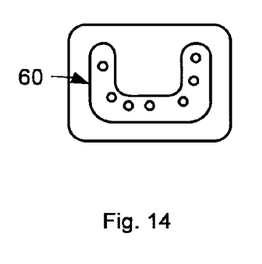
Figure 15:
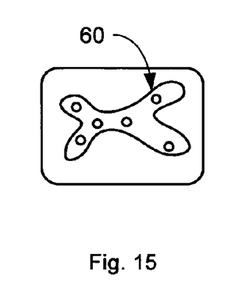

In some situations the plurality of spaced-apart adhesive/spacer islands 52, 52A may be replaced by a continuous expanses 60 of adhesive/spacer material 36 such as illustrated in FIGS. 13-15. Continuous expanse 60 of material 36 may be deposited so that it preferably occupies at most about 50% of die bonding region 38, and more preferably about 20-50% of die bonding region 38.

Figure 16:
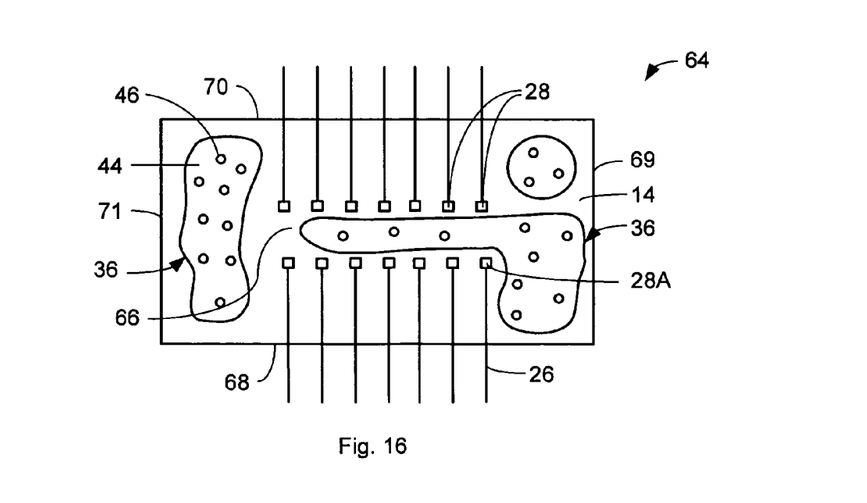
FIG. 16 is a simplified plan view of a center bonded die with adhesive/spacer material applied thereto.

The present invention finds particular utility for use with a center bonded die 64, see FIG. 16, such as a DRAM, having peripheral edges 68-71 and having bond pads 28 at a central region 66 of die 64. Wires 26 extending from bond pads 28 extend past peripheral edges 68, 70. The distance between the bond pads and the corresponding peripheral edges for a center bonded die is preferably much more than 100 micrometers. More preferably, the distance between a bond pad 28 for a center bonded die 64 and the nearest peripheral edge is at least about 40% of the corresponding length or width of the die. For example, the distance between a bond pad 28A and peripheral edge 68 is at least about 40% of the length of peripheral edge 69. Assuming peripheral edge 69 is 8 mm long, the distance between bond pad 68A and peripheral edge 68 is at least about 3.2 mm.

Figure 17:
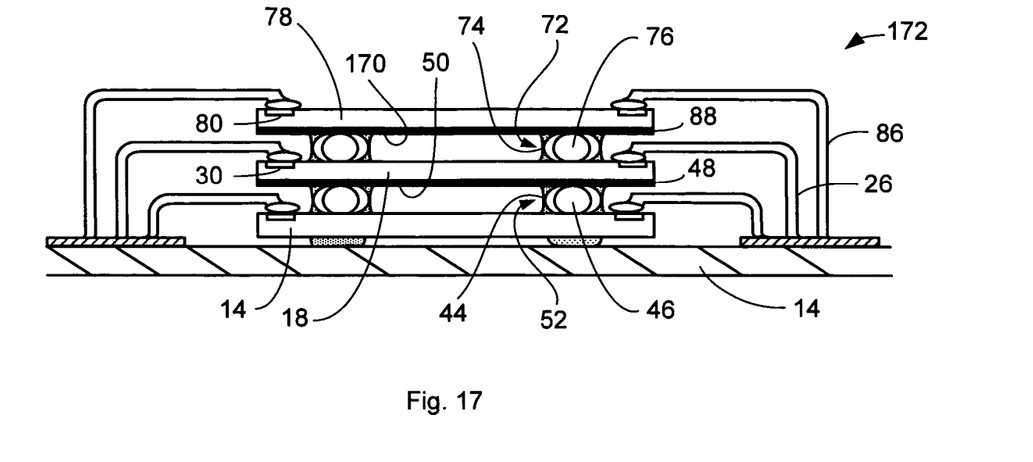
FIG. 17 is a side view of a multiple-die assembly made according an aspect of to the invention having a third die mounted upon the second die in a assembly as in FIG. 6, following deposition of adhesive/spacer material as illustrated in FIG. 5 onto the second die, and placement of the third die onto the deposits of adhesive/spacer material creating adhesive/spacer islands supporting the third die on and securing the third die to the second die.

The multiple die packages illustrated by way of example in FIG. 12 have two die in the stack, a first die and a second die. Multiple die packages according to the invention may have three or more die in the stack. A multiple die stack having three stacked die, for example, can be made by providing a multiple-die assembly as in FIG. 6, and mounting an additional die upon the second die by depositing adhesive/spacer material onto the second die generally as shown in FIG. 5 and placing the third die onto the deposits to make a three-die assembly as shown generally at 172 in FIG. 17. Referring to FIG. 17, a two die assembly as in FIG. 6 has a die 18 stacked over a die 14, which is mounted onto a substrate 12 using an adhesive (in this instance, adhesive spots are used to attach the die 14 to the substrate 12). The die 18 is separated from the die 14 by adhesive/spacer islands 52, each including adhesive 44 and at least one spacer element 46. A dielectric layer 48 applied onto the lower surface 50 of the die 18 serves to prevent electrical shorting between the die 18 and wire bonds interconnecting the die 14 and the substrate 12, and thereby allows for reduction of tolerances for the spacer dimension, as described above. Interconnection of the die 18 with the substrate 12 is made by wire bonds 26 connected to bond pads 30 on die 18. To mount an additional die 78, deposits of adhesive/spacer material, including adhesive 74 and at least one spacer element 76, are applied on the surface of die 18, generally as described above with reference to FIGS. 3-5, and then die 78, having a dielectric layer 88 applied onto the lower surface 170, is placed upon the adhesive/spacer material deposits. The resulting adhesive/spacer islands 72 provide a sufficient between the die 78 and the die 18 equal to a design wire loop height for wire bonds 26 plus an allowance for manufacturing tolerance. Electrical interconnect between the die 78 and the substrate is then made, using a wire bonding tool to connect to bond pads 80. According to the invention, further additional die can be added to the stack. When the stack is complete, an encapsulating process is employed to complete the package and, where the package is made in an array of packages on a multipackage substrate, the packages are separated from one another by saw- or punch-singulation.

The adhesive/spacer structures are shown in FIGS. 6 and 17 as constituting islands having regular size and shape; according to the invention the islands may have any of various shapes and sizes, as described above with reference, for example, to FIGS. 9-11 and 13-16.

In multiple die packages according to the invention, at least two die in the stack are separated by an adhesive/spacer structure; or, at least the lower die in the stack is separated from the substrate by an adhesive/spacer structure. All the die may be separated by spacers, at least two of them being separated by a adhesive/spacer structure; or, in some instances where one or more die is narrower than the die upon which it is stacked, no spacer may be required between those two die.

According to the invention, and generally with reference to FIGS. 6 and 12, either 14 or 18, or both 14 and 18 could constitute, rather than a die, a package including at least one die attached to and electrically connected to a substrate.

Figure 18:
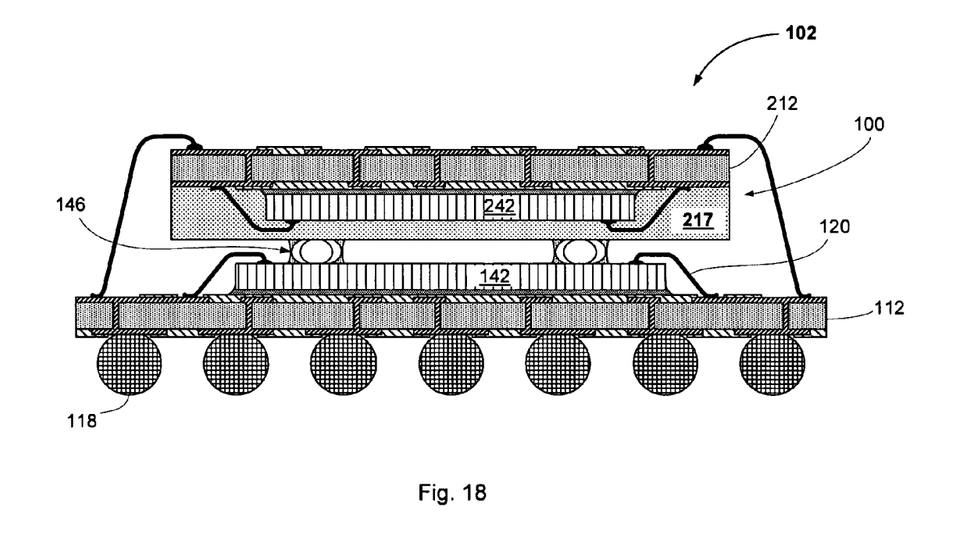
FIGS. 18 through 21 illustrate embodiments of assemblies according to various aspects of the invention in which a package and a die are stacked.
Figure 19:
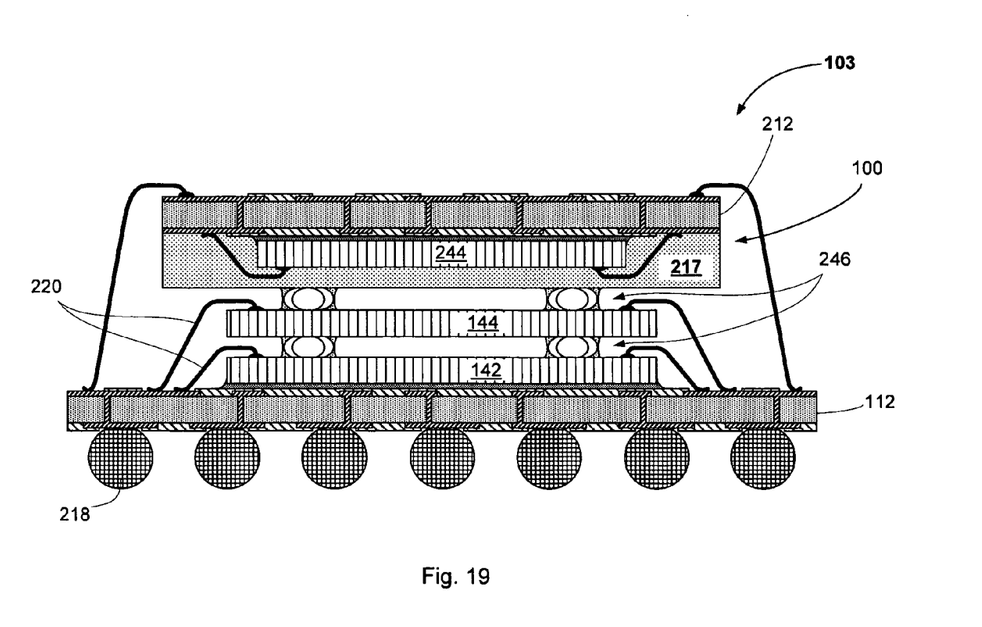

Accordingly, for example, in other embodiments, a stacked semiconductor assembly includes a package stacked with a die, separated by an adhesive/spacer material generally as described above for stacked die assemblies. FIGS. 18 and 19 illustrate examples 102, 103 of such assemblies, in which an inverted package is stacked over a die. Referring to FIG. 18, a lower, peripheral bonded die 142 is mounted upon a substrate 112, and bond pads on the die are electrically interconnected with bond pads on the substrate by wire bonds 120. An adhesive/spacer structure 146 is formed upon the die 142 including an adhesive and spacer elements arranged as discrete islands as described above with reference to adhesive/spacer structures 58. An upper package 100 is inverted and mounted upon the adhesive/spacer structure 146, in substantially the same manner as the upper die 18 is mounted upon adhesive/spacer structure 52 in the stacked die assembly 51, for example, of FIG. 6.

The upper package 100 in this example is a land grid array package, having a die 242 mounted onto a die attach side on upper package substrate 212. Die 242 in this example is wire bonded to substrate 212, and the die and wire bonds are enclosed in an encapsulation 217. The package 100 is inverted so that the land side of the substrate 212 faces away from the first die 142 and substrate 212, and so that an upper surface of the encapsulation 217 faces toward the first die 142 and substrate 212. In the orientation of FIG. 18, the land side of the inverted upper package 212 is upward-facing, and the upper package is electrically interconnected with the bottom substrate 212 by wire bonds between bond pads on the land side of the upper package substrate 212 and bond pads on the upward-facing side of the lower substrate 112. The assembly is then encapsulated (not shown in FIG. 18) to form a package, substantially as the stacked die assembly 51 of FIG. 6 is encapsulated to form the package 56 of FIG. 12. Solder balls 118 are mounted onto pads on the downward-facing side of the substrate 112, for interconnection of the package to, for example, a motherboard. Multiple chip modules having inverted package stacked over a die, in which the adhesive/spacer structures described herein may be particularly suitable, are described in U.S. patent application Ser. No. 11/014, 257.

In other embodiments, two (or more) die may be stacked using an adhesive/spacer structure over one another on a lower substrate, and a package may be stacked over the uppermost one of the stacked die, using an adhesive/spacer structure, as shown by way of example in FIG. 19. Here, a die 142 is mounted onto a lower substrate 112, and a die 144 is stacked over the die 142, and separated from it by an adhesive/spacer structure 246 as described above for stacked die assemblies. Die 142 and 144 are electrically interconnected with substrate 112 by wire bonds 220. An inverted package 100 is mounted over the stacked die 142, 144, separated by the die 144 by and adhesive/spacer structure 246, as described above with reference to FIG. 18. As will be appreciated, either or both of the spacers, between the die, and between the die and the inverted package, may be an island adhesive/spacer structure as described above with reference to stacked die assemblies.

Any of a variety of packages may be stacked over the die in assemblies according to these embodiments of the invention. Stacked multi-package modules having inverted upper packages are described in U.S. patent application Ser. No. 10/681, 572; and examples of suitable upper inverted package types are described therein. These include, for example, besides land grid array packages as illustrated in FIGS. 18 and 19, bump chip carrier packages; and the upper package may include more than one die. Where the upper package encapsulant has a generally planar surface that contacts the adhesive/spacer structure, that surface (termed the "second" surface) is itself electrically nonconductive and application of an additional insulating layer (as layer 48 in FIG. 6) may be optional in such embodiments. Where, however, the second surface of the upper package is an electrically conductive material (such as a metal heat spreader, for example) or includes exposed electrically conductive areas or elements, an insulating layer 48 should be applied, as described above with reference for example to FIG. 6.

Figure 20:
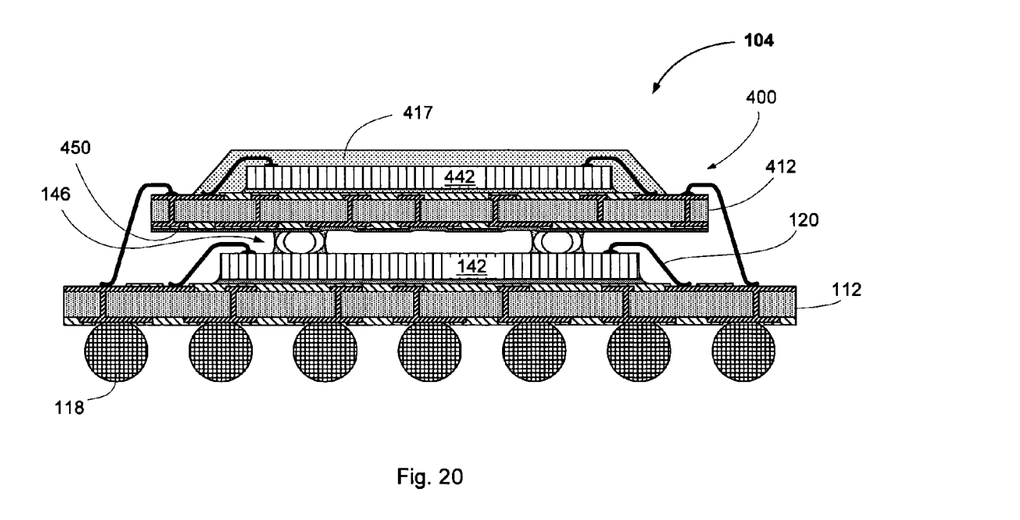
Figure 21:
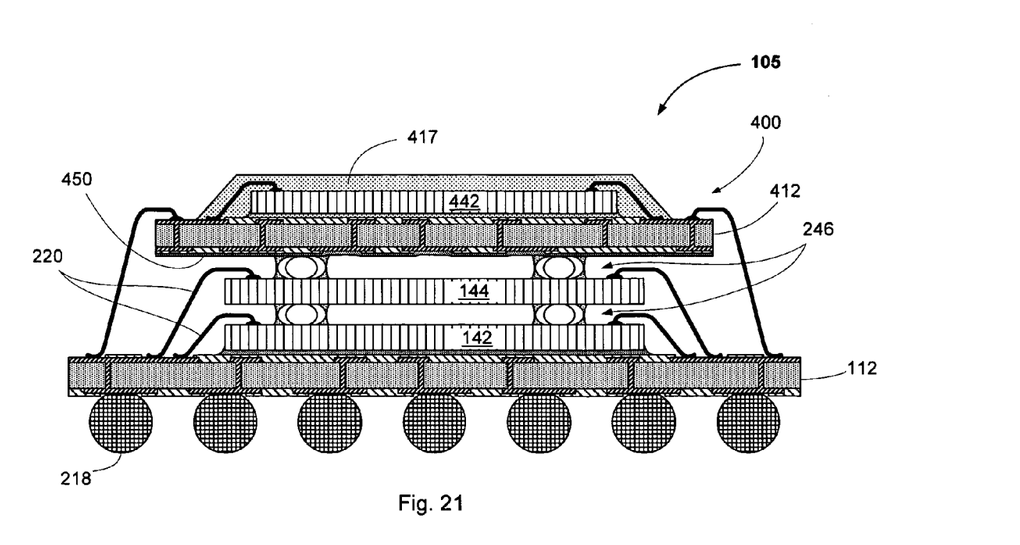

In still other embodiments, in which a stacked semiconductor assembly includes a package stacked with a die, separated by an adhesive/spacer material generally as described above for stacked die assemblies, the upper package is not inverted. FIGS. 20 and 21 illustrate examples 104, 105 of such assemblies. Referring to FIG. 20, a lower, peripheral bonded die 142 is mounted upon a substrate 112, and bond pads on the die are electrically interconnected with bond pads on the substrate by wire bonds 120. An adhesive/spacer structure 146 is formed upon the die 142 including an adhesive and spacer elements as described above with reference to adhesive/spacer structure 52. An upper package 400 is inverted and mounted upon the adhesive/spacer structure 146, in substantially the same manner as the upper die 18 is mounted upon adhesive/spacer structure 52 in the stacked die assembly 51, for example, of FIG. 6.

The upper package 400 in this example is a land grid array package, having a die 442 mounted onto a die attach side on upper package substrate 412. Die 442 in this example is wire bonded to substrate 412, and the die and wire bonds are enclosed in a mold cap 417. Here the package 400 is oriented so that the land side of the substrate 412 faces toward the first die 142 and substrate 212, and so that the land side of the upper package substrate 412 faces toward the first die 142 and substrate 212. In the orientation of FIG. 20, the land side of the inverted upper package 412 is downward-facing, and the upper package is electrically interconnected with the bottom substrate 112 by wire bonds between bond pads on the upward-facing (die attach) side of the upper package substrate 412 and bond pads on the upward-facing side of the lower substrate 112. The assembly is then encapsulated (not shown in FIG. 20) to form a package, substantially as the stacked die assembly 51 of FIG. 6 is encapsulated to form the package 56 of FIG. 12. Solder balls 118 are mounted onto pads on the downward-facing side of the substrate 112, for interconnection of the package to, for example, a motherboard.

In other embodiments, two (or more) die may be stacked using an adhesive/spacer structure over one another on a lower substrate, and a package may be stacked over the uppermost one of the stacked die, using an adhesive/spacer structure, as shown by way of example in FIG. 21. Here, as in FIG. 20, a die 142 is mounted onto a lower substrate 112, and a die 144 is stacked over the die 142, and separated from it by an adhesive/spacer structure 246 as described above for stacked die assemblies. Die 142 and 144 are electrically interconnected with substrate 112 by wire bonds 220. An inverted package 100 is mounted over the stacked die 142, 144, separated by the die 144 by and adhesive/spacer structure 246, as described above with reference to FIG. 19. As will be appreciated, either or both of the spacers, between the die, and between the die and the inverted package, may be an adhesive/spacer structure as described above with reference to stacked die assemblies.

Any of a variety of packages may be stacked over the die in assemblies according to these embodiments of the invention. Stacked multi-package modules suitable upper packages are described in U.S. patent application Ser. Nos. 10/632,549; 10/632,568; 10/632,551; 10/632,552; 10/632,553; and 10/632,550; and examples of suitable upper package types are described therein. These include, for example, besides land grid array packages as illustrated in FIGS. 20 and 21, bump chip carrier packages, and flip chip packages; and the upper package may include more than one die. Where the downward-facing surface of the upper package ("second" surface) had electrically conductive elements or areas, application of an additional insulating layer (as layer 48 in FIG. 6) may be required and may be applied as described above with reference for example to FIG. 6, and as shown for example at 450 in FIGS. 20 and 21. This additional insulating layer may be applied as a film to the land side of the upper package substrate, and voids between the film and the substrate surface removed by heating at low pressure, according to techniques known in the art.

In other embodiments (with reference again to FIG. 6, both the element 18 and the element 14 may be a package, comprising a die mounted onto and electrically connected with a substrate.

Other devices may be stacked over the first die, and separated therefrom by an adhesive/spacer structure as described above, and provided with an insulating layer as appropriate. For example, a metal heat spreader may be stacked upon an adhesive/spacer structure over the first die in place of the upper die or upper package in the descriptions above.

Other modification and variation can be made to the disclosed embodiments without departing from the subject of the invention as defined in the following claims. For example, although the above embodiments disclose the use of adhesive/spacer material 36 between lower and upper die 14, 18, material 36 may also be used with multiple die semiconductor chip packages having, for example, four die with material 36 used between one, two or three of the pairs of adjacent die. Also, although the above described embodiments show the bump reverse bonding method for attaching wires 26 to bond pads 28, 30, the conventional forward wire bonding method can also be used.

The assemblies and packages according to the invention can be useful in any of a variety of products, such as for example computers, mobile telecommunications devices, personal digital assistance devices, media storage devices, particularly portable cameras and audio and video equipment.

Any and all patents, patent applications and printed publications referred to above are incorporated by reference.

Other embodiments are within the scope of the invention.

What is claimed is:

1. A multiple-die semiconductor chip package comprising:
   a substrate;
   a first die mounted to the substrate, the first die having a first surface bounded by a periphery and having bond pads at the first surface;
   wires bonded to and extending from the bond pads outwardly past the periphery to the substrate;
   a second die with an electrically non-conductive second surface positioned opposite the first surface and defining a die bonding region therebetween, the second surface of the second die comprising a dielectric layer entirely covering the second surface;
   a plurality of spaced-apart adhesive/spacer islands within the die bonding region securing the first and second die to one another at a chosen separation to create a multiple-die assembly, the adhesive/spacer islands including deformable spacer elements having a generally ellipsoidal shape and occupying a first percentage of the die bonding region;
   the adhesive/spacer islands comprising at least one spacer element within an adhesive; and a material encapsulating the multiple-die assembly to create a multiple-die semiconductor chip package, the encapsulating material occupying a second percentage of the die bonding region.

2. The package according to claim 1 wherein the first percentage is between about 20-50 percent.

3. The package according to claim 1 wherein the first percentage is at most about 50%.

4. The package according to claim 1 wherein the wires within the die bonding region occupy a third percentage of the die bonding region, and wherein the sum of the first, second and third percentages is about 100 percent thereby effectively eliminating voids within the die bonding region.

5. The package according to claim 1 wherein:
the adhesive comprises epoxy; and
the encapsulating material comprises a filled epoxy.

6. The package according to claim 1 wherein the adhesive and the encapsulating material create an adhesive/encapsulating material boundary within the die bonding region.

7. A stacked semiconductor assembly comprising:
a first semiconductor device having a first surface bounded by a periphery and having bond pads at the first surface;
wires bonded to and extending from the bond pads outwardly past the periphery, the wires extending to a maximum height h above the first device;
a package, comprising a package die mounted to and electrically interconnected with a package substrate, the package having an electrically non-conductive second surface positioned opposite the first surface, the package comprising a dielectric layer entirely covering the second surface of the package;
the first device and the package defining a first region therebetween;
an adhesive/spacer structure within the first region, the adhesive/spacer structure contacting the first and second surfaces and adhering the first device and the package to one another at a chosen separation, the adhesive/spacer structure comprising deformable spacer elements within an adhesive, and a material encapsulating the stacked assembly, the encapsulating material occupying the first region.

8. The stacked semiconductor assembly of claim 7 wherein the package is oriented so that the die attach side of the upper package substrate faces the first device.

9. The stacked semiconductor assembly of claim 7 wherein the package is oriented so that side of the upper package substrate opposite the die attach side faces the first die.

10. Stacked semiconductor packages comprising the assembly of claim 7.

11. A multiple-die semiconductor chip package comprising:
a substrate;
a first die mounted to the substrate, the first die having a first surface bounded by a periphery and having bond pads at the first surface;
wires bonded to and extending from the bond pads outwardly past the periphery to the substrate;
a second die with an electrically non-conductive second surface positioned opposite the first surface and defining a die bonding region therebetween, the second surface of the second die comprising a dielectric layer entirely covering the second surface;
adhesive/spacer structure within the die bonding region securing the first and second surfaces to one another at a chosen separation to create a multiple-die assembly;
the adhesive/spacer structure comprising deformable spacer elements within an adhesive;
the adhesive/spacer structure occupying a first percentage of the die bonding region, the first percentage being at most about 50%; and
a material encapsulating the multiple-die assembly to create a multiple-die semiconductor chip package, the encapsulating material occupying a second percentage of the die bonding region.

12. The package according to claim 11 wherein the first percentage is about 20-50%.

13. The package according to claim 11 wherein the wires within the die bonding region occupy a third percentage of the die bonding region, and wherein the sum of the first, second and third percentages is about 100% thereby effectively eliminating voids within the die bonding region.

* * * * *